United States Patent
Aikele et al.

(10) Patent No.: US 7,862,731 B2
(45) Date of Patent: Jan. 4, 2011

(54) METHOD FOR PRODUCING INSULATION STRUCTURES

(75) Inventors: Matthias Aikele, Munich (DE); Albert Engelhardt, Munich (DE); Marcus Frey, Bernau (DE); Bernhard Schmid, Friedberg (DE); Helmut Seidel, Starnberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 1397 days.

(21) Appl. No.: 10/527,789

(22) PCT Filed: Sep. 12, 2003

(86) PCT No.: PCT/DE03/03049

§ 371 (c)(1),
(2), (4) Date: Aug. 9, 2005

(87) PCT Pub. No.: WO2004/026759

PCT Pub. Date: Apr. 1, 2004

(65) Prior Publication Data

US 2006/0121735 A1    Jun. 8, 2006

(30) Foreign Application Priority Data

Sep. 13, 2002   (DE) .................... 102 42 661

(51) Int. Cl.
*H01L 21/302* (2006.01)
*B81C 1/00* (2006.01)

(52) U.S. Cl. ................ 216/2; 216/41; 216/46; 216/49; 216/57; 216/67; 216/79; 216/99; 438/52; 438/53; 438/696; 438/700; 438/704; 438/719; 438/739; 438/753

(58) Field of Classification Search .............. 438/700, 438/702, 706, 719, 723, 724; 216/67, 74, 216/79

See application file for complete search history.

(56) References Cited

U.S. PATENT DOCUMENTS

| | | | |
|---|---|---|---|
| 5,041,898 A | | 8/1991 | Urabe et al. |
| 5,179,499 A | * | 1/1993 | MacDonald et al. ........ 361/313 |
| 5,426,070 A | * | 6/1995 | Shaw et al. .................... 216/2 |
| 5,506,175 A | * | 4/1996 | Zhang et al. ................. 438/20 |
| 5,628,917 A | * | 5/1997 | MacDonald et al. ........... 216/2 |
| 5,747,377 A | | 5/1998 | Wu |
| 5,869,354 A | * | 2/1999 | Leedy ........................ 438/110 |
| 5,930,595 A | * | 7/1999 | Sridhar et al. ................ 438/52 |
| 5,963,789 A | * | 10/1999 | Tsuchiaki .................... 438/62 |
| 6,239,473 B1 | | 5/2001 | Adams et al. |
| 6,307,247 B1 | * | 10/2001 | Davies ....................... 257/522 |

(Continued)

OTHER PUBLICATIONS

Chunbo Zhang et al.; "Fabrication of thick silicon dioxide layers using DRIE, oxidation and trench refill"; IEEE, 2002, pp. 160-163, XP010577620.

*Primary Examiner*—Anita K Alanko
(74) *Attorney, Agent, or Firm*—W. F. Fasse; W. G. Fasse

(57) ABSTRACT

To form an isolation structure in a semiconductor substrate, at least two trenches are formed with a rib therebetween in the semiconductor substrate, and then the semiconductor material in the area of the trenches and particularly the rib is converted to an electrically insulating material. For example, this is accomplished by thermal oxidation of silicon semiconductor material of the rib.

17 Claims, 3 Drawing Sheets

U.S. PATENT DOCUMENTS

| | | |
|---|---|---|
| 6,342,427 B1 | 1/2002 | Choi et al. |
| 6,461,888 B1 * | 10/2002 | Sridhar et al. .................. 438/52 |
| 6,551,944 B1 * | 4/2003 | Fallica et al. ................. 438/719 |
| 6,573,154 B1 * | 6/2003 | Sridhar et al. ............... 438/430 |
| 6,767,614 B1 * | 7/2004 | Hofmann et al. ............ 428/166 |
| 6,969,628 B2 * | 11/2005 | Bertz et al. .................... 438/48 |
| 7,540,192 B2 * | 6/2009 | Takeuchi et al. ......... 73/514.32 |
| 2001/0013630 A1 * | 8/2001 | Cho et al. .................... 257/419 |
| 2002/0001871 A1 * | 1/2002 | Cho et al. ...................... 438/98 |
| 2004/0198063 A1 * | 10/2004 | Subramanian et al. ...... 438/712 |
| 2007/0042606 A1 * | 2/2007 | Wang et al. .................. 438/700 |

* cited by examiner

METHOD FOR PRODUCING INSULATION STRUCTURES

FIELD OF THE INVENTION

The invention relates to processes for the fabrication of isolation structures for micro-machined sensors in single-crystal surface technology.

BACKGROUND INFORMATION

For micro-machined sensors in single-crystal surface technology it is necessary to mechanically anchor, on the one hand, release-etched structures, such as spring elements or parts of a plate-type capacitor at the substrate and to electrically isolate them therefrom at the same time.

From the printed publication U.S. Pat. No. 5,930,595 "Isolation process for surface micro-machined sensors and actuators" a process is known by means of which silicon structures defined by deep trenches are etched and are also released at their bottom surface towards the substrate by means of a "release-etch" step. The subsequent lining of these trenches with a non-conducting insulating material, such as silicon dioxide leads to a firm anchoring by means of a surrounding of the silicon structure with the lined trenches on three sides, leaving one side uncovered.

This process, does, however, have a number of disadvantages. The lined non-conducting material in the trench has a growth joint in the centre line. Normally, additional voids are created in the inner area of the joint. These effects result in mechanical instabilities and reliability problems.

Furthermore, the anchoring and isolation structure requires an own and comparatively time-consuming etch step for releasing the bottom surface of the structure towards the substrate, the so-called release-etch step. This step is required once again in the later manufacture of the proper mechanical structure, i.e. it is done twice in the course of the process.

From U.S. Pat. No. 6,239,473 B1 an isolation structure for micro-machined arrangements and a process for fabricating the same is known where at first a deep trench with a high aspect ratio is etched into a silicon substrate and is thereafter lined once again with a thermal or deposited silicon dioxide. Thereafter, the trench that is lined in this manner is completely undercut together with the functional structure such that the functional structure is provided with a vertical, electrical insulation against the substrate in the release-etched part. Here, too, a great disadvantage is that when the trench is lined with silicon dioxide, a growth joint as well as voids are formed in its centre which contribute in a not insignificant manner to the instability of the arrangement.

SUMMARY OF THE INVENTION

It is the object of the invention to avoid these disadvantages and to mechanically anchor the release-etched structures at the substrate in a space-saving and reliable way and to electrically insulate them from the same at the same time.

The above object has been achieved in a process according to the invention as disclosed and claimed herein.

It is the main idea of the invention—instead of lining the trenches—to convert thin-walled silicon into an electrically non-conducting material. This can, for instance, be accomplished by means of a thermal oxidation of narrow silicon ribs released prior thereto by trenches. In the minimal configuration, two trenches (holes) per rib with the required structure depth must be etched for this purpose. The silicon rib between them must be narrow enough to permit its complete thermal through oxidation.

In the course of this oxidation, the silicon is completely converted into silicon dioxide and experiences an approximate doubling of its volume.

With a continuous arrangement of trenches and suitably spaced gaps between them, a continuous isolating oxide structure can be produced over longer distances.

When the ribs are broader, the process of oxidation can also be carried out in several steps, i.e. after a first oxidation step the obtained silicon dioxide is first removed by means of an etch step and oxidised thereafter for a second time. This shortens the process times since the growth of the oxide is a root function of time, i.e. the thicker the oxide the slower the process goes.

In the manner described above, the space needed for the isolation structure becomes very small making it possible to directly accomplish differentially selected capacitive sensors. Furthermore neither growth joints nor voids are formed when this process is used so that the mechanical anchoring of the functional structure in a high quality and with long-term stability can be ensured. A time-consuming release-etch step is no longer required since the subsequent mechanical structure can be directly anchored at the "oxide pillar".

The invention permits essential improvements in the fabrication of micro-machined sensors in the surface technology on the basis of single-crystal silicon. With this technology, above all inertial sensors for acceleration and rotational speed can be fabricated. In particular, the invention serves the cost-efficient manufacture of acceleration sensors for the use of airbags in motor vehicles.

BRIEF DESCRIPTION OF THE DRAWINGS

The above objects have been achieved in a particular preferred embodiment of the inventive method of fabricating a device including a micromechanical functional structure. This method comprises the steps:

a) providing a substrate of a semiconductor material;

b) forming, in the substrate, plural trenches including first and second trenches spaced apart from each other with a rib of the semiconductor material remaining between the first and second trenches;

c) forming an electrically insulating structure between the first and second trenches and extending continuously along at least one side of the trenches by converting the semiconductor material in the rib and along the at least one side of the trenches to an insulating material, including completely converting all of the semiconductor material of the rib to the insulating material;

d) forming a micromechanical functional structure in an additional trench in the substrate adjacent to the insulating structure, such that the insulating structure extends between the additional trench and the first and second trenches, the insulating structure extends to a depth into the substrate greater than a depth of the micromechanical functional structure, and a portion of the micromechanical functional structure is mechanically connected to the insulating structure and via the insulating structure to the substrate; and e) etching around and under the micromechanical functional structure such that the micromechanical functional structure is mechanically connected with the substrate exclusively by the insulating structure, whereby the micromechanical functional structure is also electrically insulated from the substrate.

The invention is described below in greater detail with reference to embodiments and figures.

BRIEF DESCRIPTION OF THE FIGURES

Figure 1:
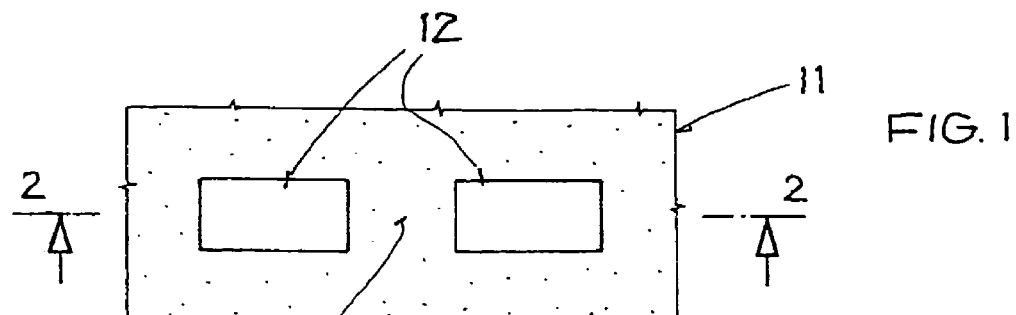

FIG. 1 shows in a top plan view a section of the substrate after the formation of a pair of trenches.

Figure 2:
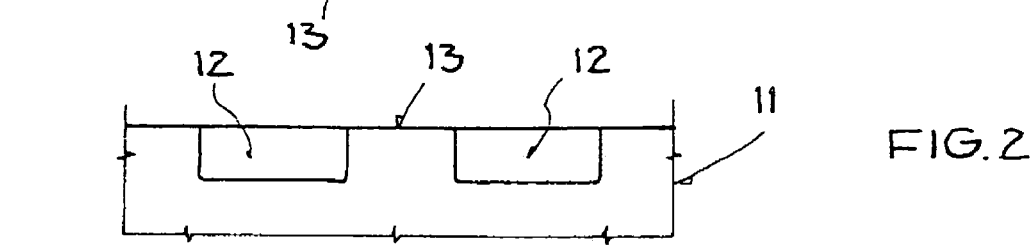

FIG. 2 shows in a cross-section the arrangement of FIG. 1 along the intersecting line 2-2.

Figure 3:
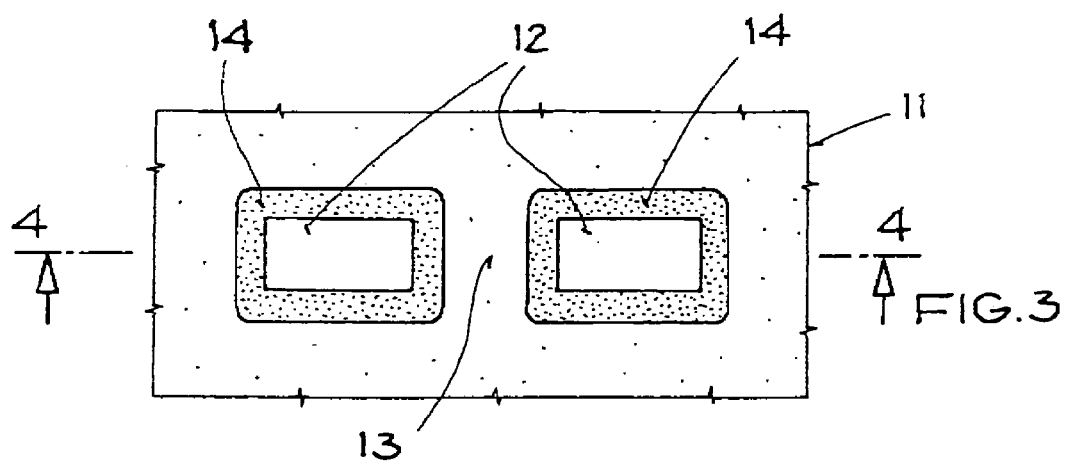

FIG. 3 shows the arrangement of FIG. 1 after the beginning of the process step of the oxidation of the silicon in the trench area.

Figure 4:
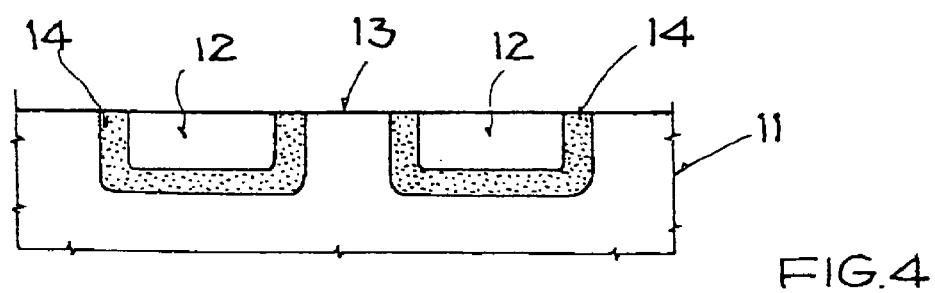

FIG. 4 shows the arrangement of FIG. 3 along the intersecting line 4-4 in cross-section.

Figure 5:
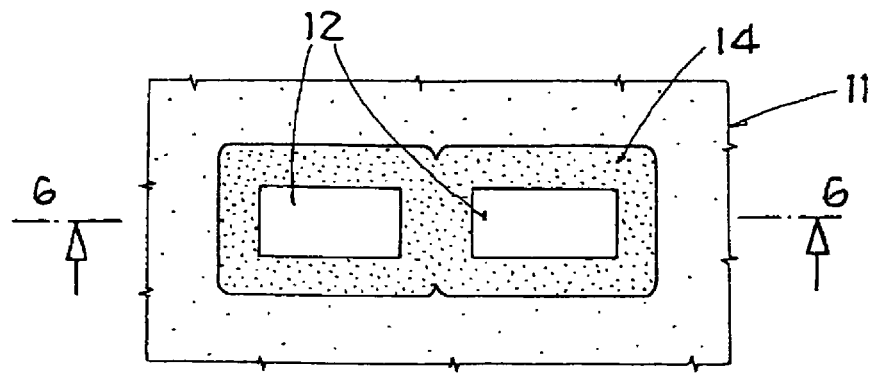

FIG. 5 shows the arrangement of FIG. 1 after the complete oxidation of the silicon between the trenches.

Figure 6:
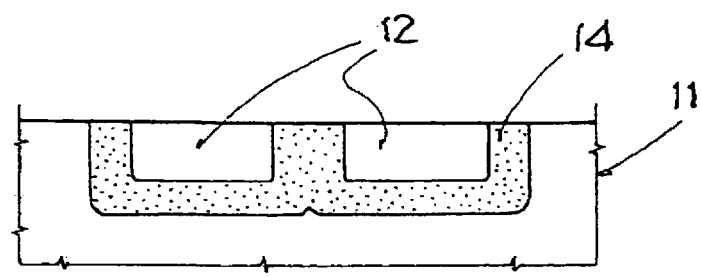

FIG. 6 shows the arrangement of FIG. 5 along the intersecting line 6-6 in cross-section.

Figure 7:
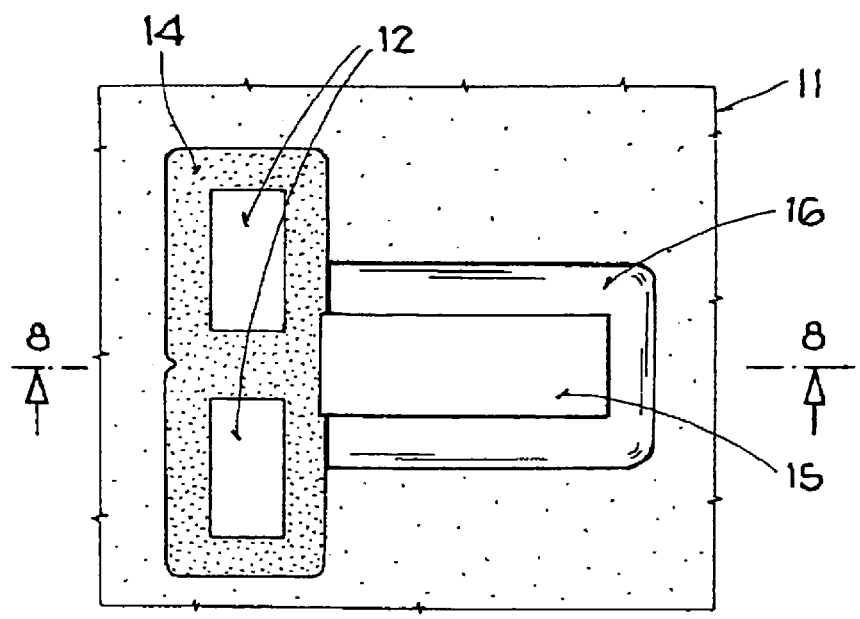

FIG. 7 shows the connection of the functional structure with the isolation structure.

Figure 8:
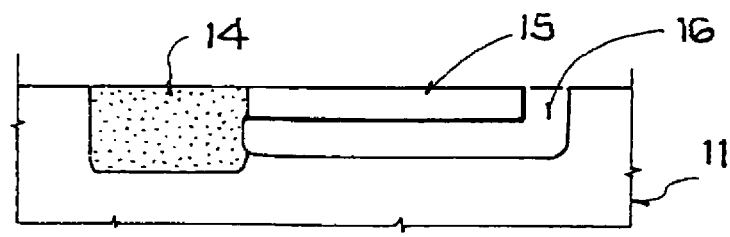

FIG. 8 shows the arrangement of FIG. 7 along the intersecting line 8-8 in cross-section.

Figure 9:
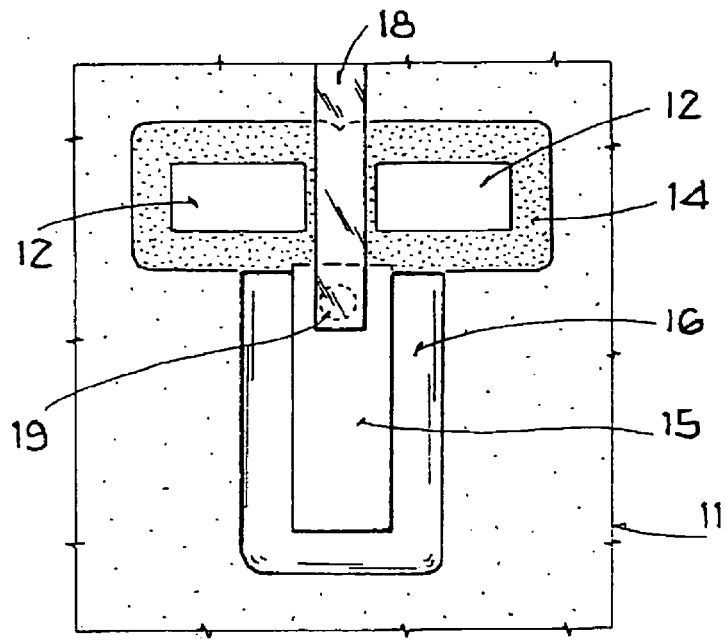

FIG. 9 shows the electric contacting of an individual structure through a track running via the isolation structure.

Figure 10:
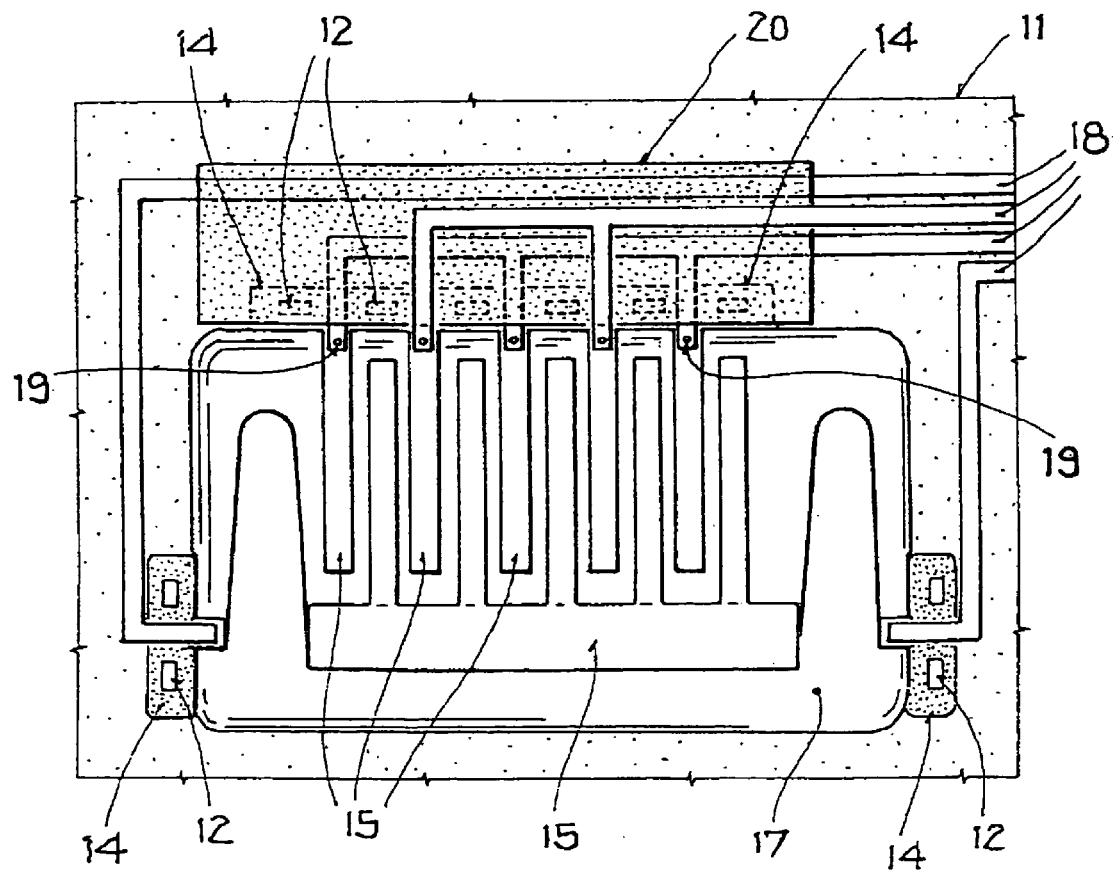

FIG. 10 shows the space-saving arrangement of a differential capacitor structure through the alternating contacting of the capacitive fingers.

DETAILED DESCRIPTION OF EXAMPLE EMBODIMENTS OF THE INVENTION

Starting from a silicon disc as substrate material 1, trenches 12 are etched for fabricating the isolation structures for the functional structures 15. At least two of them are spaced from each other such that a rib 13 of substrate material of a certain width remains between them. The silicon rib 13 must be narrow enough in order to become completely oxidised in the process step of thermal oxidation that follows later. Ideally, the width of the rib lies in the range of smaller 2 µm. At first, an etching mask is defined by means of photo-lithographic processes. This is done, for example, by means of a layer of silicon dioxide applied on the surface of the substrate disc which was structured accordingly by means of a photoresist layer or by the photoresist layer itself. Thereafter, the trenches 12 are etched out with a high aspect ratio by means of dry etching. The typical depth of the trenches 12 ranges from about 10 to 30 µm. When necessary, the etching mask is removed at the end. FIG. 1 shows in a top plan view a section of the substrate after the forming of a pair of trenches. FIG. 2 shows the arrangement of FIG. 1 along the intersecting line 2-2 in cross-section.

The intermediate ribs 13 are now converted into silicon dioxide 14 by means of thermal oxidation. FIG. 3 shows the arrangement of FIG. 1 after the beginning of the process step of the oxidation of the silicon in the trench area 14. FIG. 4 shows the arrangement of FIG. 3 along the intersecting line 4-4 in cross-section. The thermal oxidation is carried out under process conditions at typically about 1,100-1,200° C. under wet environment conditions ($H_2O$).

When the ribs 13 are broader, the process of oxidation can also be carried out in several steps, i.e. after a first oxidation step the obtained silicon dioxide 14 is first removed by means of an etch step and oxidised thereafter for a second time. The silicon dioxide $SiO_2$ is removed in a wet or dry condition. The multi-step oxidation shortens the process times since the growth of the oxide is a root function of time, i.e. the thicker the oxide the slower the process goes. FIG. 5 shows the arrangement of FIG. 1 after the complete oxidation of the silicon between the trenches 12. FIG. 6 shows the arrangement of FIG. 5 along the intersecting line 6-6 in cross-section.

Now the desired mechanical functional structure 15 is made. At first, an etching mask is made by means of photo-lithographic processes for the trench arrangement 16 which finally defines the configuration of the functional structure 15. Thereafter, the trench structure 16 is etched out with a high aspect ratio in a process step of the dry etching, and finally the side walls of the trench arrangement are passivated for the subsequent etching step. Following the passivation of the side walls, the etching mask at the bottom of the trench arrangement is selectively opened again. In the subsequent anisotropic etching step, the so-called release etch, the functional structure is so undercut that it is finally connected with the substrate by means of the isolation structure only. FIG. 7 shows the arrangement after the release etch, in particular the connection of the functional structure to the isolation structure. FIG. 8 shows the arrangement of FIG. 7 along the intersecting line 8-8 in cross-section.

As can be seen in FIG. 7, the trenches 12 and the micromechanical functional structure 15 are each respectively located and configured so that the micromechanical functional structure 15 extends longitudinally aligned with the rib 13 and is longitudinally displaced from the rib with a portion of the insulating structure 20 therebetween. As also seen in FIG. 7, the trenches 12 and the micromechanical functional structure 15 are each respectively located and configured so that the trenches 12 and the micromechanical functional structure 15 form a T-shape.

FIG. 9 shows the electric contacting of an individual functional structure 15 through a track 18 running via the isolation structure 20. The metallic tracks 18, including contact cuts 19 are made by means of processes which are customary in IC technology, if appropriate, also by using the 2-layer technology. Tracks 18 are defined and structured preferably still before the masking of the functional structures 15. As can be seen in FIGS. 9 and 10, the metallic track 18 runs longitudinally along the rib 13 on the isolation structure 20, and extends onto the functional structure 15 to make contact therewith.

FIG. 10 shows as a special embodiment an acceleration sensor with a differential capacitor structure. Both the anchoring of the two springs, by means of which the movable structure is hinged to the substrate, and the alternately contacted capacitive fingers are mechanically connected with the substrate by means of a relevant isolation structure which was created in the process in accordance with the invention. The hinge edge of the capacitive fingers is insulated throughout over a great width. For this purpose, a continuous arrangement of trenches 12 with silicon ribs between them was formed in the first step of the described process. In this way a continuous insulating oxide structure 14 can be created over comparatively long distances.

The sequence of the process is summarised once again below:

Forming of the trenches (FIGS. 1, 2):
for this purpose, a lithographic definition of an etching mask (photoresist or $SiO_2$),
dry etching of the trenches with a high aspect ratio, typical depth about 10-30 µm,
if required, removal of the etching mask (in particular of photoresist).

Conversion of the intermediate ribs into $SiO_2$ by thermal oxidation (FIGS. 3-6):
typical process conditions about 1,100-1,200° C. with wet oxidation ($H_2O$), if necessary, wet or dry removal of SiO$_2$ and repetition of oxidation.

Formation of the desired mechanical functional structure as well as of the electric contacting:
  metallic tracks, including contact cuts according to the processes customary in the IC technology, also 2-layer technology (FIGS. 9, 10),
  dry etching of the functional structure: lithography, etching of the trench structure, side wall passivation, selective opening of the etching mask at the bottom of the trench structure, release etch step (release etching) (FIGS. 7, 8).

The invention provides for essential improvements in the fabrication of micro-machined sensors in a surface technology based on single-crystal silicon. With this technology, above all inertial sensors for acceleration and rotational speed can be fabricated. In particular, the invention serves the cost-efficient manufacture of acceleration sensors for the use of airbags in motor vehicles.

The invention claimed is:

1. A process for the fabrication of isolation structures with the following process steps
   provision of a semiconductor substrate (11),
   forming of at least two trenches (12) spaced from each other in the semiconductor substrate (11) with at least one rib (13) remaining entirely between the trenches (12),
   conversion of the substrate material in the area of the trenches (12) into an electrically insulating material (14) coprising complete conversion of the entire rib or the ribs (13), and
   forming of a functional structure (15) within the substrate material which functional structure is mechanically connected with the substrate exclusively by the converted substrate material which is formed at the trenches.

2. A process according to claim 1, characterized in that silicon is used as semiconductor substrate.

3. A process according to claim 2, characterized in that the substrate material is converted by means of thermal oxidation.

4. A process according to claim 1, characterized in that a continuous insulating oxide structure (14) is created by a continuous arrangement of trenches (12) and ribs (13) between them.

5. A process according to claim 1, characterized in that the process step of conversion is a multi-step process.

6. A process according to claim 5, characterized in that after a first process step of the conversion, the so created converted material is removed and thereafter the remaining material is converted in a second process step of the conversion.

7. A method of fabricating a device including a micromechanical functional structure comprising:
   a) providing a substrate of a semiconductor material;
   b) forming, in said substrate, plural trenches including first and second trenches spaced apart from each other with a rib of said semiconductor material remaining between said first and second trenches;
   c) forming an electrically insulating structure between said first and second trenches and extending continuously along at least one side of said trenches by converting said semiconductor material in said rib and along said at least one side of said trenches to an insulating material, including completely converting all of said semiconductor material of said rib to said insulating material;
   d) forming a micromechanical functional structure in an additional trench in said substrate adjacent to said insulating structure, such that said insulating structure extends between said additional trench and said first and second trenches, said insulating structure extends to a depth into said substrate greater than a depth of said micromechanical functional structure, and a portion of said micromechanical functional structure is mechanically connected to said insulating structure and via said insulating structure to said substrate; and
   e) etching around and under said micromechanical functional structure such that said micromechanical functional structure is mechanically connected with said substrate exclusively by said insulating structure, whereby said micromechanical functional structure is also electrically insulated from said substrate.

8. The method according to claim 7, wherein said step a) comprises providing said substrate being of silicon as said semiconductor material.

9. The method according to claim 7, wherein said converting of said semiconductor material to said insulating material comprises thermal oxidation of said semiconductor material to form an oxide material as said insulating material.

10. The method according to claim 7, wherein said step b) of forming said plural trenches includes forming additional trenches in addition to said first and second trenches, such that said plural trenches are arranged in a row with a respective one of said rib of said semiconductor material remaining respectively between successive ones of said trenches, and said step c) is carried out such that said insulating structure extends continuously along said at least one side of all of said trenches.

11. The method according to claim 7, wherein said converting of said semiconductor material in said step c) comprises a multi-stage conversion in order to completely convert all of said semiconductor material of said rib to said insulating material.

12. The method according to claim 11, wherein said multi-stage conversion comprises a first conversion of some of said semiconductor material of said rib to a first amount of said insulating material, a step of removing said first amount of said insulating material, and thereafter a second conversion of a remainder of said semiconductor material of said rib to said insulating material.

13. The method according to claim 7, wherein said rib has a thickness of less than 2 μm, wherein said converting of said semiconductor material in said rib in said step c) consists of a single thermal oxidation step that completely converts all of said semiconductor material of said rib to said insulating material.

14. The method according to claim 7, wherein said trenches and said micromechanical functional structure are each respectively located and configured so that said micromechanical functional structure extends longitudinally aligned with said rib and is longitudinally displaced from said rib with a portion of said insulating structure therebetween.

15. The method according to claim 14, wherein said trenches and said micromechanical functional structure are each respectively located and configured so that said first and second trenches and said micromechanical functional structure together form a T-shape.

16. The method according to claim 7, further comprising a step of providing a metallic strip running longitudinally along said rib on said insulating structure, and extending onto and electrically contacting said micromechanical functional structure.

17. The method according to claim 7, wherein said rib includes all material between said first and second trenches.

* * * * *